United States Patent
Ahn et al.

(10) Patent No.: US 9,232,571 B2
(45) Date of Patent: Jan. 5, 2016

(54) FLEXIBLE DISPLAY DEVICE

(71) Applicants: Yi-Joon Ahn, Yongin (KR); Katsumasa Yoshii, Yongin (KR); Jong-In Baek, Yongin (KR); Dae-Sung Choi, Yongin (KR); Yong-Seok Yeo, Yongin (KR); Ki-Seo Kim, Yongin (KR)

(72) Inventors: Yi-Joon Ahn, Yongin (KR); Katsumasa Yoshii, Yongin (KR); Jong-In Baek, Yongin (KR); Dae-Sung Choi, Yongin (KR); Yong-Seok Yeo, Yongin (KR); Ki-Seo Kim, Yongin (KR)

(73) Assignee: SAMSUNG DISPLAY CO., LTD., Yongin, Gyunggi-Do (KR)

(*) Notice: Subject to any disclaimer, the term of this patent is extended or adjusted under 35 U.S.C. 154(b) by 389 days.

(21) Appl. No.: 13/677,667

(22) Filed: Nov. 15, 2012

(65) Prior Publication Data

US 2014/0015402 A1 Jan. 16, 2014

(30) Foreign Application Priority Data

Jul. 10, 2012 (KR) .................. 10-2012-0075146

(51) Int. Cl.
- *H05B 33/02* (2006.01)
- *H01L 27/32* (2006.01)
- *H01L 27/20* (2006.01)

(52) U.S. Cl.
CPC ............. *H05B 33/02* (2013.01); *H01L 27/20* (2013.01); *H01L 27/3225* (2013.01); *H01L 2251/5338* (2013.01)

(58) Field of Classification Search
USPC .......................................................... 313/511
See application file for complete search history.

(56) References Cited

U.S. PATENT DOCUMENTS

| | | | | |
|---|---|---|---|---|
| 6,453,100 B1 * | 9/2002 | Takeuchi et al. | .............. | 385/120 |
| 7,719,164 B2 | 5/2010 | Gologanu et al. | | |
| 2012/0312585 A1 * | 12/2012 | Baek et al. | ............ | 174/254 |

FOREIGN PATENT DOCUMENTS

| | | | |
|---|---|---|---|
| JP | 2003-280546 A | | 10/2003 |
| KR | 1020110097708 A | * | 8/2011 |
| KR | 10-2011-0122244 A | | 11/2011 |

* cited by examiner

*Primary Examiner* — Nimeshkumar Patel
*Assistant Examiner* — Brenitra M Lee
(74) *Attorney, Agent, or Firm* — Lee & Morse, P.C.

(57) ABSTRACT

A flexible display device includes a flexible display panel, a plurality of supports on a first surface of the flexible display panel, the plurality of supports being spaced apart from each other, and an actuator on the first surface of the flexible display panel, the actuator being between the supports. The actuator includes an electroactive polymer layer, and a first electrode layer and a second electrode layer that are respectively arranged on an upper surface and a lower surface of the electroactive polymer layer, and the actuator having a property such that when a voltage is applied to the first electrode layer and the second electrode layer, an area of the electroactive polymer layer is changed.

16 Claims, 4 Drawing Sheets

FLEXIBLE DISPLAY DEVICE

CROSS-REFERENCE TO RELATED PATENT APPLICATION

This application claims the benefit under 35 U.S.C. §119 of Korean Patent Application No. 10-2012-0075146, filed on Jul. 10, 2012, in the Korean Intellectual Property Office, the disclosure of which is incorporated herein in its entirety by reference.

BACKGROUND

1. Field

Embodiments relate to a flexible display device, and more particularly, to a flexible display device in which flexibility is adjustable.

2. Description of the Related Art

As display-related technology has been developed, flexible displays that can be folded or rolled in the form of a roll have been developed.

Organic light-emitting displays have superior characteristics, such as wide viewing angles, excellent contrast, short response times, low power consumption, and the like. The scope of applications from personal portable devices, such as MP3 players, mobile phones, and the like, to TVs has increased. Organic light-emitting displays have self light-emitting characteristics, and thus, do not require an additional light source. As such, their thickness and weight can be reduced.

SUMMARY

Embodiments relate to a flexible display device including a flexible display panel, a plurality of supports on a first surface of the flexible display panel, the supports being spaced apart from each other, and an actuator on the first surface of the flexible display panel. The actuator being between the supports. The actuator includes an electroactive polymer layer, and a first electrode layer and a second electrode layer that are respectively arranged on an upper surface and a lower surface of the electroactive polymer layer, and the actuator having a property such that when a voltage is applied to the first electrode layer and the second electrode layer, an area of the electroactive polymer layer is changed.

When the voltage is applied to the first electrode layer and the second electrode layer, the area of the electroactive polymer layer may be increased such that the electroactive polymer layer contacts side walls of the supports.

An interval between two adjacent supports from among the supports may be smaller than a maximum width of the electroactive polymer layer to which the voltage is applied.

At least one of the first electrode layer and the second electrode layer may be a compliant electrode.

The supports and the first electrode layer may be adhered to the first surface of the flexible display panel via an adhesive layer.

The electroactive polymer layer may have a trapezoidal vertical cross section and may taper in a direction extending from the first electrode layer toward the second electrode layer from the first electrode layer.

The second electrode layer may be a compliant electrode.

The electroactive polymer layer may include a plurality of electroactive polymer layers arranged in a lattice pattern. The supports within the lattice pattern may have island forms.

The flexible display device may further include a support film that is attached to the second electrode layer at a lower surface of the actuator and to lower surfaces of the supports.

The supports may have trapezoidal vertical cross sections of which longer sides correspond to the lower surfaces of the supports.

The first electrode may be a compliant electrode.

Upper surfaces of the supports may be adhered to the first surface of the flexible display panel via an adhesive layer.

The supports may be parallel to each other in a stripe pattern.

The flexible display device may further include a switch for applying a voltage to the first electrode layer and the second electrode layer.

The electroactive polymer layer may include any one of a dielectric elastomer, a ferroelectric polymer, and a liquid crystal elastomer.

The first surface of the flexible display panel may oppose a surface of the flexible display panel on which an image is displayed.

The flexible display panel may be an organic light-emitting display panel.

BRIEF DESCRIPTION OF THE DRAWINGS

The above features will become more apparent by describing in detail exemplary embodiments thereof with reference to the attached drawings in which.

DETAILED DESCRIPTION

Figure 1:
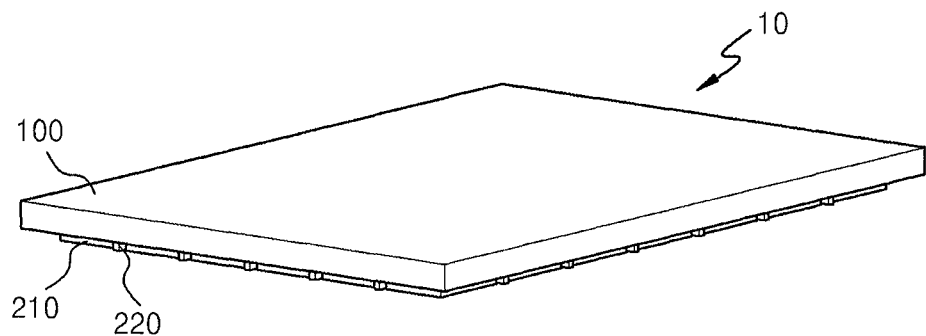
FIG. 1 is a schematic perspective diagram of a flexible display device according to an embodiment.

Embodiments will now be described more fully with reference to the accompanying drawings, in which exemplary embodiments are shown. As used herein, the term "and/or" includes any and all combinations of one or more of the associated listed items. Expressions such as "at least one of," when preceding a list of elements, modify the entire list of elements and do not modify the individual elements of the list.

Elements in the following drawings may be exaggerated, omitted, or schematically illustrated for conveniences and clarity of explanation, and the sizes of elements do not reflect their actual sizes completely. In addition, in description of elements, it will be understood that when an element or layer is referred to as being "on" or "under" another element or layer, the element or layer can be directly on another element or layer or intervening elements or layers. Criteria such as "on," "under," "upper," and "lower" will be provided based on the drawings. Like reference numerals may denote like elements in different drawings.

Figure 2:
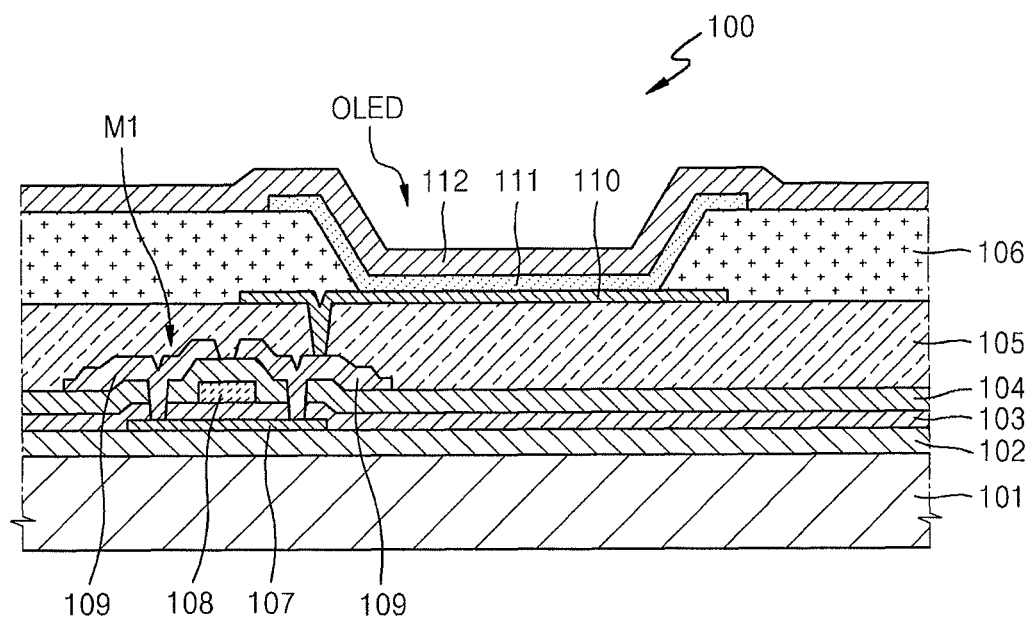
FIG. 2 is a cross-sectional view of a flexible display panel of the display device of FIG. 1, according to an embodiment.
Figure 3:
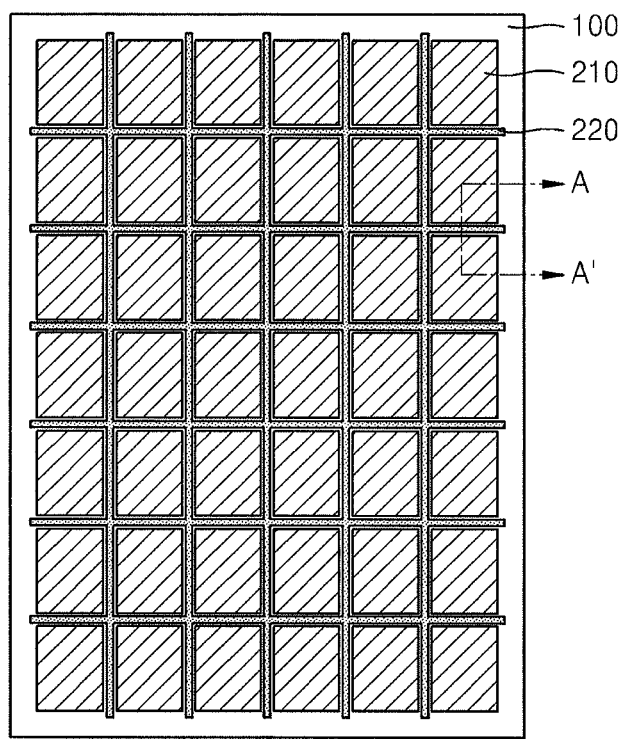
FIG. 3 is a plan view of a bottom surface of the display device of FIG. 1, according to an embodiment.
Figure 4A:
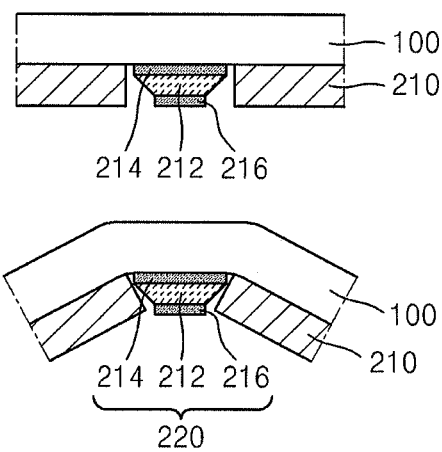
FIG. 4A and FIG. 4B are cross-sectional views of the flexible display panel taken along line A-A' of FIG. 3.

FIG. 1 is a schematic perspective diagram of a flexible display device 10 according to an embodiment. FIG. 2 is a cross-sectional view of a flexible display panel 100 of the display device 10 of FIG. 1, according to an embodiment. FIG. 3 is a plan view of a bottom surface of the display device 10 of FIG. 1, according to an embodiment. FIG. 4A and FIG.

4B are cross-sectional views of the flexible display panel 100 taken along line A-A' of FIG. 3.

Referring to FIGS. 1 through 4B, the flexible display device 10 may include the flexible display panel 100, a plurality of supports 210 that are formed on a first surface of the flexible display panel 100 and are spaced apart from each other, and actuators 220 that are formed between the supports 210 on the first surface of the flexible display panel 100.

The flexible display panel 100 may be flexible and rollable. Thus, the flexible display panel 100 may have excellent maintenance and portability. The flexible display panel 100 may be, for example, an organic light-emitting display panel, a liquid crystal display panel, or the like. FIG. 2 illustrates an organic light-emitting display panel as an example of the flexible display panel 100. In detail, FIG. 2 illustrates a top emission-type organic light-emitting display panel as an example. In another implementation, the flexible display panel 100 may be a bottom emission-type organic light-emitting display panel.

Referring to FIG. 2, the flexible display panel 100 that is an organic light-emitting display panel may include a driving thin film transistor (TFT) M1 formed on a substrate 101 and an organic light-emitting device (OLED).

The substrate 101 may be formed of a plastic material such as acryl, polyimide, polycarbonate, polyester, Mylar, or the like such that the flexible display panel 100 may be flexible.

An insulating layer 102 such as a barrier layer and/or a buffer layer may be formed on the substrate 101 in order to prevent impurity ions from being diffused, to prevent moisture or external air from penetrating, and to planarize a surface of the substrate 101.

An active layer 107 of the driving TFT M1 may be formed of a semiconductor material on the insulating layer 102 and a gate insulating layer 103 may be formed to cover the active layer 107. The active layer 107 may be formed of an inorganic semiconductor such as amorphous silicon or polysilicon, or an organic semiconductor.

A gate electrode 108 is formed on the gate insulating layer 103, and an interlayer insulating layer 104 is formed to cover the gate electrode 108. In addition, source/drain electrodes 109 are formed on the interlayer insulating layer 104, and a passivation layer 105 and a pixel definition layer 106 are sequentially formed to cover the source/drain electrodes 109.

The gate electrode 108 and the source/drain electrodes 109 may be formed of a metal such as aluminum (Al), molybdenum (Mo), gold (Au), silver (Ag), platinum (Pt)/palladium (Pd), copper (Cu), or the like, as examples. In other implementations, a resin paste containing these metals in the form of powder may be coated on the gate electrode 108 and the source/drain electrodes 109, or a conductive polymer may be used.

In addition, the gate insulating layer 103, the interlayer insulating layer 104, the passivation layer 105, and the pixel definition layer 106 may each be an insulator, may each include a single layer or a multilayered structure, and may be formed of an organic material, an inorganic material, or organic/inorganic complex.

Although not shown, a switching TFT and a storage capacitor may be formed via the same process as a process for forming the driving TFT M1. In other implementations, TFT having various other suitable structures may be used.

The OLED may display predetermined image information by emitting red, green, and blue light according to current and may include a pixel electrode 110 connected to any one of the source/drain electrodes 109 of the driving TFT M1, an opposite electrode 112 formed to cover an entire pixel, and an organic light-emitting layer 111 that is formed between the pixel electrode 110 and the opposite electrode 112 and emits light.

The flexible display panel 100 is flexible. The supports 210 and the actuators 220 are formed on the first surface of the flexible display panel 100, as shown in FIG. 3. Thus, the flexibility of the flexible display panel 100 may be adjusted. The first surface of the flexible display panel 100 may be an opposite surface to a surface on which an image is displayed. That is, when the flexible display panel 100 is a top emission-type display panel, like in FIG. 2, the first surface is a bottom surface of the substrate 101. On the other hand, when the flexible display panel 100 is a bottom emission-type display panel, unlike in FIG. 2, the first surface is a surface of an opposite side of the substrate 101. Hereinafter, for purposes of explanation, it is assumed that the flexible display panel 100 is a top-emission type display panel.

FIG. 4A is a cross-sectional view of the flexible display panel 100 taken along line A-A' of FIG. 3. Referring to FIGS. 3 and 4A, the supports 210 may be attached onto the first surface of the flexible display panel 100, that is, the bottom surface of the substrate 101, via an adhesive layer (not shown) or the like so as to be spaced apart from each other. The supports 210 may be formed of a thermoplastic resin material having excellent mechanical properties and thermal resistance. For example, the supports 210 may be formed of, polymethyl methacrylate (PMMA), polycarbonate (PC), polyethylene terephthalate (PET), or the like.

The actuators 220 are formed between the supports 210 on the first surface of the flexible display panel 100. An actuator 220 may include an electroactive polymer layer 212, and a first electrode layer 214 and a second electrode layer 216 that are respectively formed on upper and lower surfaces of the electroactive polymer layer 212. The actuator 220 may constitute a capacitor.

The electroactive polymer layer 212 may be formed of any one of a dielectric elastomer, a ferroelectric polymer, and a liquid crystal elastomer such that an area of the electroactive polymer layer 212 may be changed when a voltage is applied thereto.

The first electrode layer 214 and the second electrode layer 216 are respectively formed on the upper and lower surfaces of the electroactive polymer layer 212 and are connected to an external circuit (not shown) for applying a voltage to the electroactive polymer layer 212.

At least one of the first electrode layer 214 and the second electrode layer 216 may be a compliant electrode. The compliant electrode may be formed by coating and drying a paste including a conductive oxide such as indium tin oxide (ITO), conductive particles such as metal particles, a conductive polymer, a carbon nanotube, or the like, on the electroactive polymer layer 212. The paste may be coated by a spraying method, a screen printing method, an inkjet method, a spin coating method, or the like.

When a voltage is applied to the actuator 220, an area of the actuator 220 is changed. Thereby the flexibility of the flexible display device 10 may be adjusted.

Figure 4B:
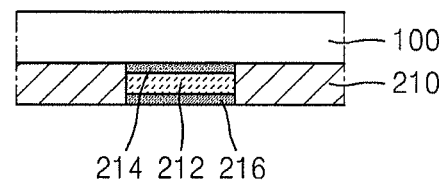

FIG. 4A illustrates a case where a voltage is not applied to the actuator 220. FIG. 4B illustrates a case where a voltage is applied to the actuator 220.

As shown in FIG. 4A, when a voltage is not applied to the actuator 220, the electroactive polymer layer 212 is maintained spaced apart from the supports 210.

For example, the electroactive polymer layer 212 may have a trapezoidal vertical cross section. In this case, the width of the trapezoidal vertical cross section may taper from the first electrode layer 214 toward electroactive polymer layer 212.

Thus, there is an interval between the actuators 220 and the supports 210, such that the flexible display panel 100 may be moved. Accordingly, the flexible display device 10 may be maintained flexible.

According to an implementation, the first electrode layer 214 may be attached on the first surface of the flexible display panel 100 via an adhesive layer (not shown). In this case, the first electrode layer 214 may not be a compliant electrode. The first electrode layer 214 may have a similar area to a maximum area of the electroactive polymer layer 212 to which a voltage is applied and may be attached onto the first surface of the flexible display panel 100. Accordingly, the first electrode layer 214 may not respond to a change in the area of the electroactive polymer layer 212 and may maintain a constant area.

On the other hand, the second electrode layer 216 may be a compliant electrode. Thus, when an area of the electroactive polymer layer 212 is increased, an area of the second electrode layer 216 is also changed, thereby preventing the second electrode layer 216 and the electroactive polymer layer 212 from being separated from each other.

FIG. 4B shows a case where an area of the electroactive polymer layer 212 is increased when a voltage is applied to the first electrode layer 214 and the second electrode layer 216.

When a voltage is applied between the first electrode layer 214 and the second electrode layer 216, an electrostatic force is generated due to charges generated in the first electrode layer 214 and the second electrode layer 216. The electroactive polymer layer 212 contracts in a thickness direction and elongates in a width direction due to the generated electrostatic force. In this case, the second electrode layer 216 formed of a compliant electrode also contracts in a thickness direction and elongates in a width direction.

The supports 210 may each have a side wall perpendicular to the flexible display panel 100 and attached to the first surface of the flexible display panel 100. Thus, the supports 210 may function as a barrier against an increase in the area of the actuator 220.

FIG. 3 shows a case where the actuators 220 are arranged in a lattice pattern, and the supports 210 are positioned within the lattice pattern to have island forms. In this case, the supports 210 may have various sizes and intervals as long as the supports 210 do not affect a radius of curvature of the flexible display panel 100. In other implementations, other arrangements of the actuators 220 and the supports 210 are possible.

Referring to FIG. 3, the supports 210 are foamed outside all the actuators 220 so as to limit an increase of the area of the actuators 220. When a voltage is applied to the electroactive polymer layer 212 and the area of the electroactive polymer layer 212 is increased, the electroactive polymer layer 212 contacts the side walls of the supports 210, as shown in FIG. 4B. Thus, the flexibility of the flexible display panel 100 is reduced. Accordingly, user convenience of using the flexible display device 10 may be increased.

In addition, an interval between two adjacent supports 210 from among the supports 210 may be smaller than a maximum width of the electroactive polymer layer 212 to which a voltage is applied. When the interval between two adjacent supports 210 from among the supports 210 is smaller than a maximum width of the electroactive polymer layer 212 to which a voltage is applied, a force to push the side walls of the supports 210 by the electroactive polymer layer 212 may be further increased, thereby further effectively reducing the flexibility of the flexible display panel 100.

When the voltage is no longer applied to the first electrode layer 214 and the second electrode layer 216, the electroactive polymer layer 212 may be restored to its original shape.

In addition, the flexible display device 10 may further include a switch (not shown) for applying a voltage to the first electrode layer 214 and the second electrode layer 216. A user may conveniently use the flexible display device 10 by turning 'on' the switch to reduce the flexibility of the flexible display device 10 when the user wants to use the flexible display device 10.

Application of a voltage to the first electrode layer 214 and the second electrode layer 216 may be automatically controlled by a controller (not shown). For example, when the flexible display device 10 is spread with both hands in order to use the flexible display device 10, a detector (not shown) may detect the flatness of the flexible display panel 100, and then, the controller may apply a voltage to the first electrode layer 214 and the second electrode layer 216 according to the detection result.

Thus, according to the present embodiment, the flexibility of the flexible display device 10 may freely be controlled and changed, thereby increasing user convenience of using the flexible display device 10.

Figure 5:
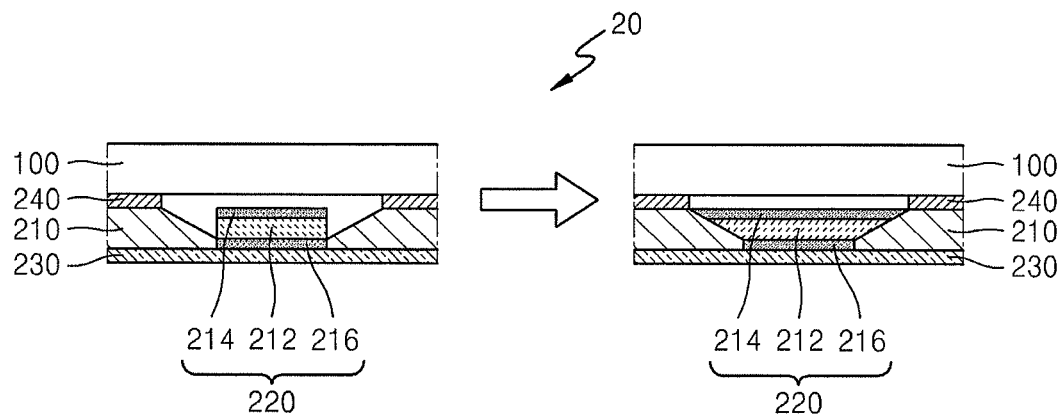
FIG. 5 is a cross-sectional view of a flexible display device according to another embodiment.

FIG. 5 is a cross-sectional view of a flexible display device 20 according to another embodiment. The cross-sectional view corresponds to the same area of the flexible display panel 100 as FIG. 4A and FIG. 4B.

Referring to FIG. 5, the flexible display device 20 may include the flexible display panel 100, and the supports 210 and the actuators 220 that are formed on the first surface of the flexible display panel 100. Each of the actuators 220 may include the electroactive polymer layer 212, and the first electrode layer 214 and the second electrode layer 216 that are respectively formed on the upper and lower surfaces of the electroactive polymer layer 212.

The flexible display panel 100, the supports 210, and the actuators 220 shown in FIG. 5 are almost the same as those shown in FIGS. 1 through 4, and detailed description thereof will not be repeated except to explain differences from what is shown in FIGS. 1 through 4.

Referring to FIG. 5, the flexible display device 20 further includes a support film 230 that is adhered to lower surfaces of the supports 210 and lower surfaces of the actuators 220. The support film 230 may be formed of a polymer material such as polyimide. The support film 230 is adhered to the lower surfaces of the supports 210 and lower surfaces of second electrode layers 216 included in the actuators 220 via an adhesive layer (not shown) or the like, thereby protecting the supports 210 and the actuators 220 from external shock or preventing the supports 210 and the actuators 220 from being scratched.

By forming the supports 210 and the actuators 220 on the support film 230 and then adhering the support film 230 on which the supports 210 and the actuators 220 are formed onto the first surface of the flexible display panel 100, the flexible display device 20 may be easily manufactured.

FIG. 5 shows a change in shape of the electroactive polymer layer 212 as a voltage is applied to the first electrode layer 214 and the second electrode layer 216. As described with reference to FIG. 4A and FIG. 4B, when a voltage is not applied to the first electrode layer 214 and the second electrode layer 216, the flexible display device 20 is configured in such a way that the electroactive polymer layer 212 may be spaced apart from the supports 210.

For example, a support 210 may have a trapezoidal vertical cross section in which a longer side corresponds to a lower surface of the support 210. That is, the support 210 may taper from the lower surface towards an upper surface. In other implementations, the electroactive polymer layer 212 may have side walls perpendicular to the support film 230

The support 210 and the electroactive polymer layer 212 may be spaced apart from each other. Accordingly, the flexible display panel 100 may move up and down, thereby maintaining the flexibility of the flexible display device 10.

The upper surface of the support 210 may be attached to the first surface of the flexible display panel 100 via an adhesive layer 240. In other implementations, the actuators 220 are not adhered to the flexible display panel 100. The first electrode layer 214 may be formed of a compliant electrode and may not be adhered onto the first surface of the flexible display panel 100 via the adhesive layer 240. Thus, when an area of the electroactive polymer layer 212 is changed by applying a voltage to the electroactive polymer layer 212, an area of the first electrode layer 214 is also changed, thereby preventing the first electrode layer 214 and the electroactive polymer layer 212 from being separated from each other.

The second electrode layer 216 may have a similar area to a maximum area of the electroactive polymer layer 212 to which a voltage is applied and may be attached onto the support film 230. Accordingly, the second electrode layer 216 may not be formed of a compliant electrode.

When a voltage is applied to the first electrode layer 214 and the second electrode layer 216, areas of the electroactive polymer layer 212 and the first electrode layer 214 are increased. In this case, the support 210 limits an increase in area of the electroactive polymer layer 212. When a voltage is applied to the electroactive polymer layer 212 and the area of the electroactive polymer layer 212 is increased, the electroactive polymer layer 212 contacts the side walls of the support 210, thereby reducing the flexibility of the flexible display panel 100. Accordingly, user convenience of using the flexible display device 20 may be increased.

Figure 6:
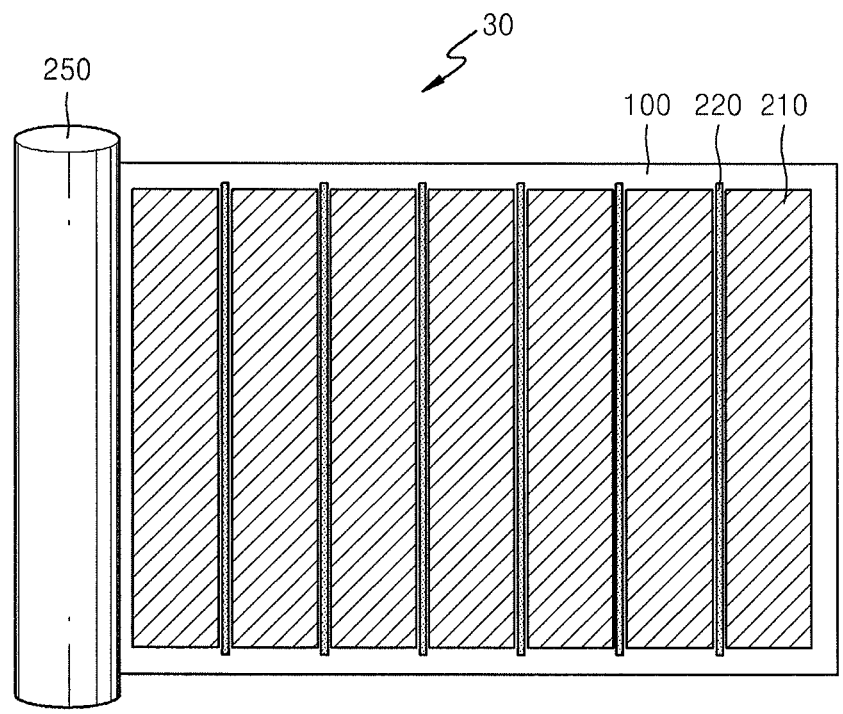
FIG. 6 is a diagram of a flexible display device according to another embodiment.

FIG. 6 is a diagram of a flexible display device 30 according to another embodiment.

Referring to FIG. 6, the flexible display device 30 may include the flexible display panel 100, and the supports 210 and the actuators 220 that are formed on a lower surface of the flexible display panel 100.

The flexible display panel 100, the supports 210, and the actuators 220 are almost the same as those shown in FIGS. 1 through 4, and detailed description thereof is not repeated, except to explain differences from what is shown in FIGS. 1 through 4.

FIG. 6 shows the flexible display device 30 that is windable in roll form. The flexible display panel 100 may be rotatably disposed in a roll frame 250.

In addition, the supports 210 are arranged in parallel to each other in a stripe pattern on the first surface of the flexible display panel 100. The actuators 220 are disposed between the supports 210, and thus, the flexibility of the flexible display panel 100 in one direction may be controlled by applying a voltage to the actuators 220.

The flexible display device 30 of FIG. 6 may further include a support film as described with reference to FIG. 5. Cross sections of the actuators 220 and the supports 210 of FIG. 6 may be the same as cross sections of the actuators 220 and the supports 210 of FIGS. 4A and 4B or FIG. 5.

The structure of a flexible display device according to an embodiment and a method of manufacturing the flexible display device according to the embodiment may be varied, and the whole or parts of the embodiments may be selectively combined so as to implement various modifications.

By way of summation and review, a flexible organic light-emitting display apparatus can be provided by using a plastic substrate. Flexibility may be increased by reducing the thickness of the display panel. A display panel having greater flexibility may be used as a portable and rollable display panel. However, during the using of a flexible display panel, the display panel may need to be placed on the ground or to be held with both hands to provide stability. Thus, a user may experience inconvenience of using the display panel.

According to the one or more embodiments, the flexibility of a flexible display device may be adjusted, thereby increasing the portability of the flexible display device and user convenience of using the flexible display device.

While the present invention has been particularly shown and described with reference to exemplary embodiments thereof, it will be understood by those of ordinary skill in the art that various changes in form and details may be made therein without departing from the spirit and scope as defined by the following claims.

What is claimed is:

1. A flexible display device comprising:
   a flexible display panel;
   a plurality of supports on a first outer surface of the flexible display panel, the supports being spaced apart from each other; and
   an actuator on the first outer surface of the flexible display panel, the actuator being between the supports, the actuator including an electroactive polymer layer, and a first electrode layer and a second electrode layer that are respectively arranged on an upper surface and a lower surface of the electroactive polymer layer, and
   the actuator having a property such that when a voltage is applied to the first electrode layer and the second electrode layer, an area of the electroactive polymer layer is changed,
   the plurality of supports and the actuator being located with respect to each other on the first outer surface of the flexible display panel such that the electroactive polymer layer is contactable with side walls of the supports under a condition that the voltage is applied to the first electrode layer and the second electrode layer.

2. The flexible display device of claim 1, wherein the plurality of supports and the actuator are located with respect to each other on the first outer surface of the flexible display panel such that an interval between two adjacent supports from among the supports is smaller than a maximum width of the electroactive polymer layer under the condition that the voltage is applied to the first electrode layer and the second electrode layer.

3. The flexible display device of claim 1, wherein at least one of the first electrode layer and the second electrode layer is a compliant electrode.

4. The flexible display device of claim 1, wherein the supports and the first electrode layer are adhered to the first outer surface of the flexible display panel via an adhesive layer.

5. The flexible display device of claim 4, wherein the electroactive polymer layer has a trapezoidal vertical cross section and tapers in a direction extending from the first electrode layer toward the second electrode layer.

6. The flexible display device of claim 5, wherein the second electrode layer is a compliant electrode.

7. The flexible display device of claim 1, wherein:
   the electroactive polymer layer includes a plurality of electroactive polymer layers arranged in a lattice pattern, and
   the supports within the lattice pattern have island forms.

8. The flexible display device of claim 1, further comprising a support film that is attached to the second electrode layer at a lower surface of the actuator and to lower surfaces of the supports.

9. The flexible display device of claim 8, wherein the supports have trapezoidal vertical cross sections of which longer sides correspond to the lower surfaces of the supports.

10. The flexible display device of claim 9, wherein the first electrode is a compliant electrode.

11. The flexible display device of claim 10, wherein upper surfaces of the supports are adhered to the first outer surface of the flexible display panel via an adhesive layer.

12. The flexible display device of claim 1, wherein the supports are parallel to each other in a stripe pattern.

13. The flexible display device of claim 1, further comprising a switch for applying a voltage to the first electrode layer and the second electrode layer.

14. The flexible display device of claim 1, wherein the electroactive polymer layer includes any one of a dielectric elastomer, a ferroelectric polymer, and a liquid crystal elastomer.

15. The flexible display device of claim 1, wherein the first outer surface of the flexible display panel opposes a surface of the flexible display panel on which an image is displayed.

16. The flexible display device of claim 1, wherein the flexible display panel is an organic light-emitting display panel.

* * * * *